VARIABLE IMPEDANCE DEVICE FOR TUNERS

Filed March 4, 1963 2 Sheets-Sheet 1

INVENTOR

JIMMIE E. WARTHAN

BY *Mason, Kolehmainen, Rathburn and Wyss*

ATT'YS

Nov. 2, 1965 J. E. WARTHAN 3,215,960

VARIABLE IMPEDANCE DEVICE FOR TUNERS

Filed March 4, 1963 2 Sheets-Sheet 2

INVENTOR

JIMMIE E. WARTHAN

BY Mason, Kolehmainen, Rathburn and Wyss

ATT'YS 3,215,960

VARIABLE IMPEDANCE DEVICE FOR TUNERS

Jimmie E. Warthan, Stinesville, Ind., assignor to Sarkes Tarzian, Inc., Bloomington, Ind., a corporation of Indiana Filed Mar. 4, 1963, Ser. No. 262,444
13 Claims. (Cl. 334—76)

The present invention relates to tuners, and, more particularly, to tuners suitable for use in radio and television receiving apparatus and the like.

Television tuners commonly in use today may be generally classified as being of two types. The first type is generally identified as a switch type tuner in which a number of switch wafers are employed for the various RF amplifier, mixer and oscillator portions of the tuner. Each of these switch wafers comprises a rotar and a stator, the stator carrying a number of stationary contacts between which are connected incremental inductances which may be selectively connected into the various portions of the tuner by means of the rotor switch contacts. The other type of tuner is generally known as a turret type tuner and employs a rotatable switching drum which carries a number of individual panels on which are positioned the tuning coils for the various portions of the tuner such as the RF amplifier oscillator, mixer, and oscillator sections. This drum is rotated bodily by means of the main tuning shaft so that individual panels are selectively moved into engagement with a set of stationary contacts so that different tuning coils can be connected into the circuitry of the tuner.

In television tuners of both the switch type and the turret type, it is becoming increasingly important that the tuner occupy a minimum amount of space lengthwise of the tuner shaft due to the ever increasing demand for shallower, more compact television receivers. In many tuners of both types a fine tuning arrangement is employed which comprises a variable inductance or capacitance having a movable core or plunger adjusted from the conventional fine tuning shaft which usually surrounds the main tuning shaft of the tuner. Generally the latter shaft carries a cam acting upon the core or plunger to vary the position of the latter. If the core or plunger is relatively short there is a tendency for the plunger to jam within its support as a result of side thrusts produced by the rotation of the cam. This tendency is magnified when cams having a rapidly sloping cam surface are used. An impedance element having a long plunger or core is not subject to jamming problems but, since the fine tuning variable impedance is usually mounted in such a position that the movable core thereof is parallel to the main tuning shaft of the tuner, the use of a relatively long variable impedance gives rise to an increase in the overall length of the tuner.

In turret type tuners the variable impedance may extend lengthwise of the turret and parallel to the fine tuning shaft so that space is generally available to accommodate even long variable impedances. However, in tuners of the switch type where the first switch wafer extends parallel to and is only slightly displaced from the front wall of the tuner chassis upon which the variable inductance is to be mounted, there is no space available for a long variable impedance. Therefore, the use of short variable impedance tuning devices is especially desirable for use in tuners of the latter type although, to conserve space, they are also perferred for turret type tuners. In an attempt to meet this problem, it has been proposed prior to the present invention to use a hinge interposed between the core and the cams so that the cam does not act directly on the core but instead imparts any side thrusts to the hinge without transferring them to the core. However, these hinges have been expensive to manufacture and difficult to install and, in addition, they have been susceptible to frequent failure, thus giving rise to service and maintenance problems.

It is, therefore, an important object of the present invention to provide a new and improved tuner in which a variable impedance type of fine tuning is employed without substantially increasing the overall length of the tuner.

A further object of the invention is to provide a new and improved variable impedance element for use in tuners which element is of minimum length in order to conserve space.

Another object of the invention is to provide a variable impedance element having a movable core biased outwardly by a coil spring which is partially housed within the core in order to minimize losses.

Still another object of the invention is to provide a variable impedance element having a movable core and so constructed and arranged that a relatively small core movement is required to effect a desired change in impedance.

The invention has for another object the provision of a new and improved tuner employing a unitary variable impedance and hinged leaf which may be manufactured very inexpensively and may be installed easily in a single operation.

Yet another object of the invention is to provide a unitary impedance and hinged leaf construction of the type described which is compact and of minimum length but is nevertheless characterized by a long, trouble free operating life.

A still further object of the invention is to provide a tuner having a new and improved hinged leaf construction for acting upon the core of a variable impedance of the type described.

The invention has for a further object the provision of a hinged leaf construction of the character described above which is easy to install and inexpensive to make but is nevertheless efficient and foolproof in operation.

It is also an object of the invention to provide a unitary variable impedance and hinged leaf construction which is formed of plastic material such as polypropylene to minimize the cost and to take advantage of many of the desirable qualities of such material.

Briefly stated, the improved television tuner of the present invention includes a U-shaped chassis having a bight portion and a pair of upstanding end legs. The chassis supports a rotatable shaft movable to different channel selecting positions for connecting different impedance elements to an oscillator circuit on the chassis.

Fine tuning of the tuner is accomplished through a variable inductor having a movable core which is adjustable by a face cam disc mounted concentrically with the main tuning shaft. The cam acts upon a hinged leaf formed integrally with a body member and joined thereto by a thin, flexible section permitting flexing of the leaf. The body member carries an open ended, hollow, cylindrical support which, in effect, serves as a coil form and carries the winding of the variable inductor. A core is mounted for sliding movement within the support and is biased by a spring towards the open end of the support and into engagement with the leaf so that the core is moved when the leaf is flexed by the cam. The body member includes integral legs insertable through a slot in the front end leg of the tuner chassis for embracing the chassis to hold the body member in position. The biasing spring encircles an axial stud within the support and is seated within an axial recess in the core to minimize losses which might be caused by the metal in the spring.

The invention, both as to its organization and manner of operation, together with further objects and advantages thereof, will best be understood by reference to the following detailed description taken in conjunction with the accompanying drawings, wherein.

Figure 1:
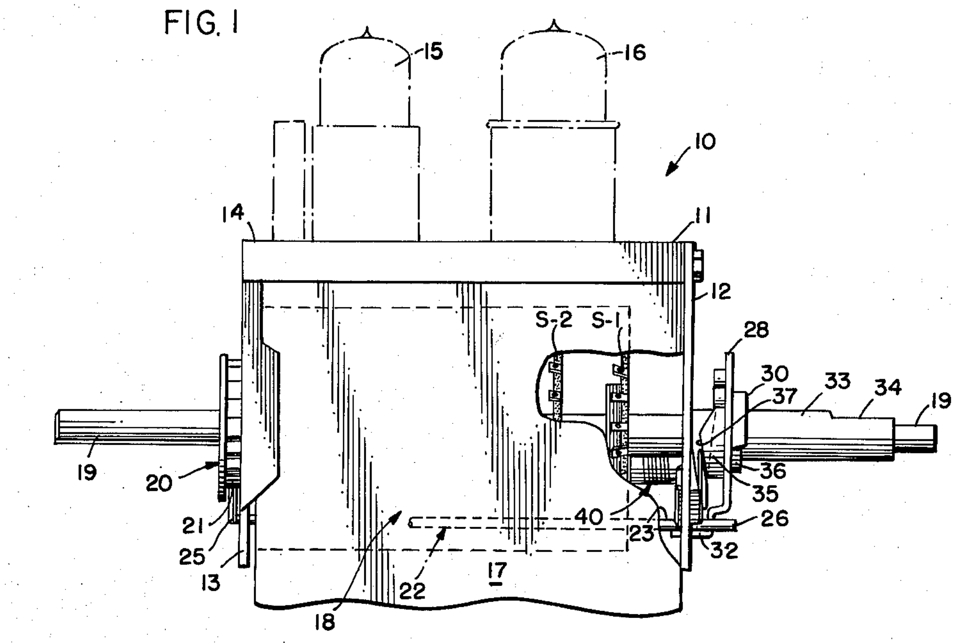
FIG. 1 is a side elevational view of a television tuner characterized by the features of the present invention with certain portions of the shielding cover broken away to show the variable fine tuning impedance element.
Figure 2:
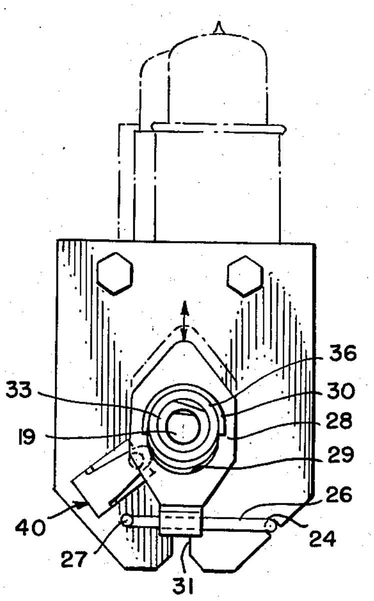
FIG. 2 is an end view of the tuner taken from the right end as viewed in FIG. 1.

Referring now to the drawings, and first to FIGS. 1 and 2, the present invention is there illustrated as comprising a television tuner generally indicated by the reference numeral 10 and including a substantially U-shaped chassis 11 having front and rear end walls 12 and 13 interconnected by a top deck portion 14 on which are mounted tube sockets for a pair of tubes 15 and 16. Preferably the tube 15 is a pentode and acts as the radio frequency amplifier of the tuner while the tube 16 is preferably a double triode functioning as both the mixer and local oscillator of the tuner. A sheet metal cover or shield 17 is wrapped around the exposed sides and bottom of the chassis 11 and cooperates with the other portions of the chassis to completely enclose and shield the component elements mounted within the tuner. The end walls 12 and 13 support a rotary channel selector switch indicated generally by the reference numeral 18 and comprising a plurality of switch wafers S–1 which are supported on suitable rods (not shown) extending longitudinally of the tuner chassis and secured to the front wall 12. As was indicated above, the tuner 10 need not be of the switch type but may also be a turret type tuner although the switch type is illustrated in FIG. 1 because the limited space available between the wall 12 and the first wafer magnifies the problem of providing a relatively short fine tuning impedance. Any suitable means, such as, for example, ceramic spacers may be used to fixedly position the switch wafers S–1, etc. in the desired spaced apart relationship within the tuner chassis compartment. Each of the switch wafers S–1, etc. includes a stator portion secured by any appropriate means to the chassis and provided with a central opening within which is positioned a switch rotor. All of the rotors of the switch wafers are mounted upon a main tuning or channel selector shaft 19 which extends transversely through openings in the rotors having a configuration corresponding to the cross section of the shaft. For example, the opening in each switch rotor may be D-shaped and the shaft 19 may have a similar cross section configuration. The shaft 19 extends through aligned openings in the front and rear walls 12 and 13 which openings provide bearing surfaces lying adjacent the shaft.

In accordance with conventional practice, each of the switch wafers is provided with a plurality of spaced stator contacts which are secured to the stator portion of the switch wafer to be selectively engaged by contact means mounted on the rotor. The contact means carried by the rotor are selectively engageable with different ones of the stator contacts for each angular channel selecting position of the main tuning shaft 19.

A suitable detant mechanism 20 is effectively connected between the selector shaft 19 and the rear wall 13 of the chassis 11 to facilitate accurate positioning of this shaft in each of the channel selecting positions. This detent mechanism may be of the type disclosed and claimed in U.S. application Serial No. 63,889 of A. A. Valdettaro et al., filed October 20, 1960 and assigned the same assignee as the present invention. More specifically, the detent mechanism preferably comprises an index wheel 21 having a toothed periphery and mounted for rotation with the main tuning shaft 19 in a position adjacent the rear wall 13 of the chassis. A torsion type spring 22 is provided for performing the dual function of engaging the index wheel 21 and of biasing the main tuning shaft 19 against its bearing surfaces. The spring 22 includes a center or bight portion 23 supported within aligned openings or notches formed in the front and rear walls 12 and 13 of the tuner chassis, the notch in the front wall 12 being indicated in FIG. 2 by the reference numeral 24. The torsion spring further includes a first end portion or rear arm 25 having a V-shaped bend riding against the index wheel 21 and biased into engagement with the peripheral teeth on this wheel to perform the detent function in locating and positioning the main tuning shaft 19 in each of the different angular positions representing the assigned television channels. The torsion bar spring 22 further includes a forward arm 26 for engaging a retaining plate 28 which supports the main tuning shaft 19. Prior to assembly of the bar spring 22 onto the chassis 11 the arms 25 and 26 are offset one from the other. When the torsion bar spring is inserted into the notches or openings 24 in the front and rear walls of the chassis, the V-shaped bend or hook on the rear arm portion 25 is seated within one of the notches on the index wheel 21 while the forward arm portion 26 is flexed to bias the retaining plate 28 downwardly as viewed in FIGS. 1 and 2. The retaining plate 28 is provided with an elongated or oval shaped opening 29 and with a raised collar or boss extending forwardly from the plate and approximately half way around the latter opening. The retaining plate 28 is mounted for sliding movement upon the wall 12 within a slot 31 extending upwardly from the bottom of this wall. This slot leads to a central opening in the front wall through which the main tuning shaft 19 extends. To mount the retaining plate within the slot 31, the plate is provided with an inwardly bent leg 32 having aligned slots therein which cooperate to form a guide track embracing the front wall of the tuner chassis in the vicinity of the slot 31. The forward arm 26 of the torsion bar spring 22 is inserted over the leg 32 and serves to urge the retaining plate toward the bottom or open end of the slot.

To provide for fine tuning of each of the television channels selected by the main tuning shaft 19, the tuner includes a fine tuning shaft 33 concentric with the main tuning shaft 19 and having a non-circular outer end portion 34 for receiving a conventional fine tuning knob which is not shown in the drawings. The fine tuning shaft has a central axial opening therein of circular configuration to permit the main tuning shaft to be turned without disturbing the setting of the fine tuning shaft. The inner end of the fine tuning shaft is drivingly engaged with a cam 35 having a circular boss 36 therein extending through the elongated opening 29 in the retaining plate. The raised collar 30 on the retaining plate engages the circular boss of the cam and forms a bearing surface. The end face of the cam 35 adjacent the front wall 12 is provided with a gradually tapering cam surface 37 which cooperates with the variable impedance element of the present invention to vary the fine tuning when the shaft 33 is rotated. The fine tuning shaft, the cam and retaining plate as illustrated are merely illustrative of several different types which could be used with the variable impedance type of the present invention and the detailed construction of these elements per se forms no part of the present invention. They are described in greater detail in application Serial No. 263,096, now Patent No. 3,172,062, filed by A. A. Valdettaro et al. filed simultaneously with the present application and assigned to the same assignee as the present application.

Figure 8:
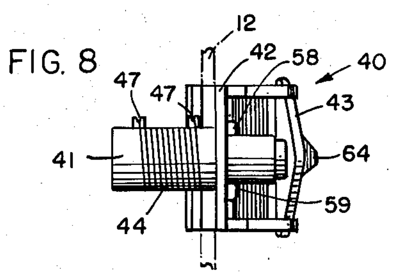
FIG. 8 is a top plan view looking in the direction of the arrow pointed lines 8—8 in FIG. 4.

The variable impedance device of the present invention is identified in the drawing by the reference numeral 40 and a cylindrical hollow support 41 formed integral with a body portion or member 42 upon which is pivotally secured a hinge arm 43. The cylindrical support 41, the body member 42 and the hinge arm 43 are preferably molded as an integral unit from a suitable plastic material such as polypropylene which is, of course, an excellent insulator. While the variable impedance device could be either a variable inductor or a variable capacitor it is illustrated in the drawings as a variable inductor and, to this end, a coil or winding 44 is wound around the exterior of the cylindrical support or coil form 41. Each of the ends or leads 45 and 46 of the winding is passed through a slot formed in a raised boss 47 best shown in FIG. 8. After the ends of the windings have been seated in the slots the bosses are preferably heat sealed in order to hold the coil leads firm in position and, hence, to prevent movement of the coil turns or unravelling from the coil form. The coil form and its winding 44 are adapted to be inserted through an opening 48 formed in the front wall 12 of the tuner chassis. It will be observed that the coil form is very short and, hence, can be accommodated within the space provided in the tuner compartment between the front wall 12 of the chassis and the first switch wafer or deck S–1. Thus, the variable inductor of the present invention does not necessitate an increase in the length of the tuner even if it is used in a switch type tuner. The body member 42 of the variable impedance device includes a flat deck having a pair of upstanding legs 49 and 50 with the leg 49 being provided with a small outwardly extending bead or lip 51 at its outer end and the leg 50 being provided with a somewhat larger bead or lip 52. To assemble the variable impedance device onto the front wall 12 of the tuner chassis the two legs 49 and 50 are adapted to be inserted into a square or rectangularly shaped opening 53 in the wall 12. To make the assembly the leg 50 is first inserted into the opening 53 and the variable impedance device is moved within the slot until the edge of the wall 12 indicated at 54 is seated within the space formed between the bead 52 and the flat upper edge of the body portion 42. The variable impedance device is then pushed forwardly or toward the front wall 12 as viewed in FIG. 3 with the coil form 41 and the winding 44 passing through the circular opening 48 until the inclined upper edge of the leg 49 engages the edge 55 of the wall 12. The assembly is completed by further pushing the variable impedance device until the bead 51 snaps over the edge 55 whereupon this edge is seated in the slot formed between the bead 51 and the flat upper edge of the body member 42. The variable impedance device is thus held firmly in position on the front wall 12 by the legs 49 and 50 and their beads 51 and 52. A pair of integral laterally extending ears 56 and 57 on the side of the body member limit the movement of the variable impedance device into the front wall 12 of the chasis and, hence, prevent the device from being pushed too far. A pair of studs 58 and 59 formed integral with the underside of the body member extend toward the hinge arm 43 to serve as stops for limiting the movement of the hinge arm toward the body member 42 while the variable impedance device is being pushed into position on the tuner chassis.

The hinge arm 43 is secured to the body portion 42 by a thin flexible film portion 60 which provides a hinge to permit pivotal movement or flexing of the hinge arm upon the body member. The film extends between the inner end of the hinge arm and an outer end wall 61 depending downwardly from the body member 42. The body member further includes a pair of tapered side walls 62 and 63. The hinge arm is relatively flat but includes an outwardly extending central longitudinally extending, reinforcing rib 64 for adding rigidity to the arm and an outer bearing surface or tip 65 against which the cam 35 bears. The hinge arm further includes a pair of laterally extending teats 66 and 67 which, during shipment and storage prior to installation, are adopted to engage hooks 68 and 69, respectively. More specifically, the hook 68 is formed integral with the side wall 62 while the hook 69 extends outwardly from the side wall 63 and each hook includes an outer hook portion overlying the associated teat 66 or 67 on the hinge arm 43. Under normal operating conditions after installation of the device 40, the cam is effective to move the hinge arm between the limiting positions respectively shown in FIGS. 4 and 5 and, hence, the teats 66 and 67 do not engage the hooks. Thus, the cam 35 is adapted to move the hinge arm 43 between a first limiting position shown in FIG. 4 where the tip 65 is most remote from the front wall 12 and a second limiting position shown in FIG. 5 where the arm is deflected fully inwardly about the hinge 60.

A core or plunger 70 formed of suitable ferro-magnetic material such as powdered iron has an outer end portion engaging the underside of the hinge arm 43 so as to be moved axially in the coil form 41 when the hinge arm is pivoted about the hinge 60 by the cam. The core or plunger includes an axial bore 72 extending inwardly from the inner end. A coil spring 74 biases the core or plunger outwardly to urge the end portion 71 into engagement with the hinge arm 43. This coil spring is seated within the bore 72 and encircles a stud 75 formed integrally with the coil form 41 and extending axially of the coil form into the bore 72. A major portion of the coil spring 74 is thus seated within the bore in order to minimize losses which might be caused by the iron or other metallic material of the spring. In addition, the described construction wherein a considerable portion of the core is hollowed out provides an inductor of quite small depth which is particularly desirable in shallow cabinet applications which require a tuner of correspondingly shallow dimensions.

Figures 3, 4, 5:
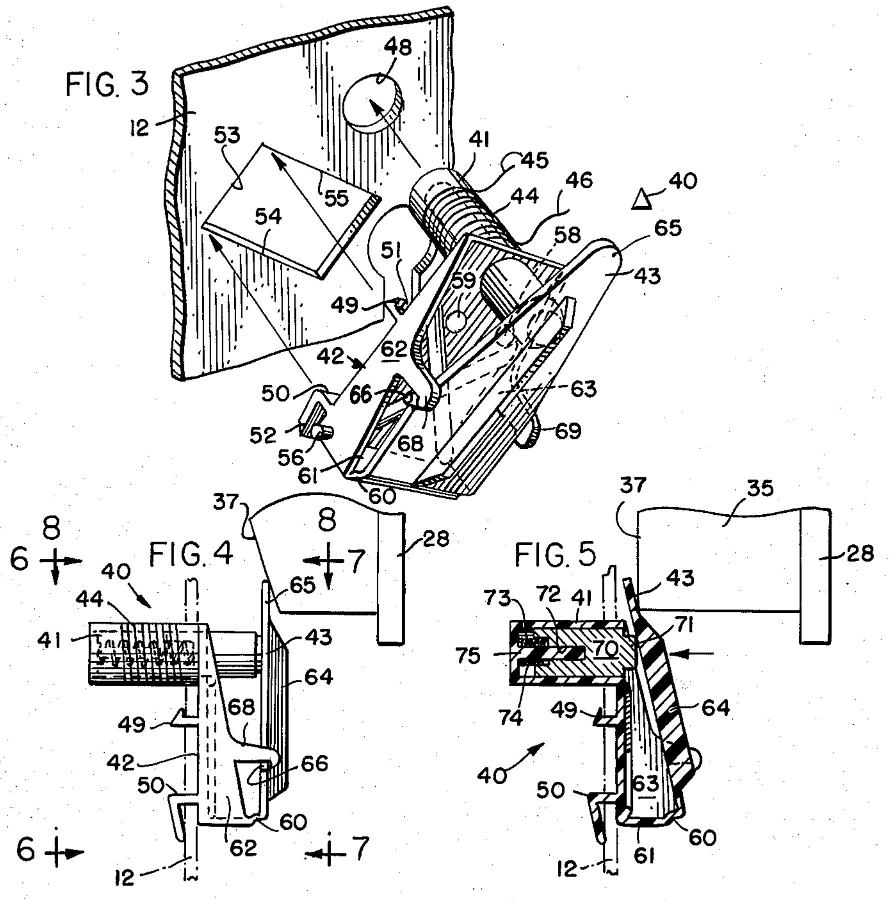
FIG. 3 is an exploded, fragmentary perspective view showing the fine tuning impedance unit of the present invention including its integrally formed support and hinge arm with the unit being separated from the chassis of the tuner but in position preparatory for assembly thereon.
FIG. 4 is an enlarged fragmentary, side elevational view showing the variable impedance element, its support and hinge arm mounted upon the tuner chassis and acted upon by the cam of the fine tuning adjusting mechanism with the chassis being shown in broken lines.
FIG. 5 is a sectional view similar to FIG. 4 but shows the hinge arm deflected inwardly by the cam.
Figure 6:
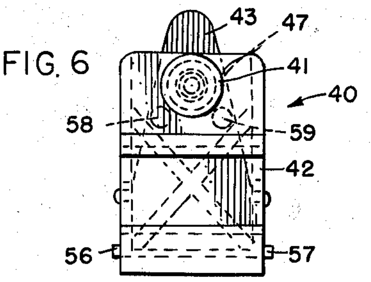
FIG. 6 is an end view looking in the direction of the arrow pointed lines 6—6 in FIG. 4.
Figure 7:
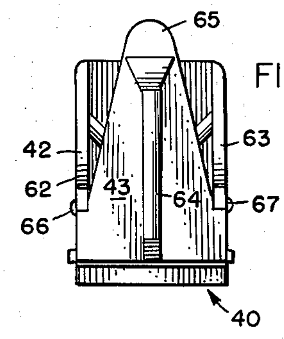
FIG. 7 is an end view looking in the direction of the arrow pointed lines 7—7 in FIG. 4.

In view of the foregoing description it will be observed that as the cam 35 is turned by rotation of the fine tuning shaft 33, the hinge arm 43 is deflected about the hinge 60 between the limiting positions shown in FIGS. 4 and 5. As the hinge arm is deflected, the core 70 moves axially within the coil form to vary the inductance of the variable inductor device 40 and, hence, tuning the tuner circuits. As will be recognized by those skilled in the art, the fine tuning shaft 33 may be adjusted to select any desired fine tuning impedance in order to obtain sharp tuning of the channel selected by the main tuning shaft 19. Due to the provision of the relatively wide hinge 60 the hinge arm 43 is effectively supported at widely spaced points so that the bearing surface or tip 65 of the hinge arm is not free to move laterally with respect to the edge portion 71. Accordingly, any side thrust forces imparted to the hinge arm tip 65 upon rotation of the cam surface 37 are not passed to the core 70. This avoids the possibility of wedging or jamming the core within the coil form 41.

In view of the foregoing description, it will be observed that the structure illustrated and described is effective to accomplish all of the enumerated objects of the invention. The hinge arm flexible film hinge and the coil form and its support are all made in a single molding operation, thus producing a construction that is small and compact and is, at the same time, very inexpensive to manufacture. The device may be very easily assembled on the tuner chassis since a single unit is employed and the necessity for handling several small parts is avoided. In addition, the variable tuning element is so constructed and arranged that it is not subject to losses resulting from the coil spring used to bias the core into engagement with he hinge arm. The variable inductor is very short and, for this reason, does not increase the overall length of the tuner but, despite this short length, the movable core is not subject to jamming within the coil form.

While a particular embodiment of the invention has been illustrated and described, it will be apparent that many modifications and changes will readily occur to those skilled in this art and it is therefore contemplated by the appended claims to cover any such changes and modifications as fall within the true spirit and scope of the invention.

What is claimed as new and desired to be secured by Letters Patent of the United States is:

1. In a tuner for use in receiving equipment to select different stations, a chassis, the combination of a fine tuning adjustable impedance device including a movable element for varying the impedance of said device, adjusting means operable to adjust said fine tuning device by moving said movable element, a unitary, one piece member including a relatively rigid body portion having means thereon for detachably securing said body portion to the chassis, and a leaf formed integrally with said body portion and attached thereto by a thin, flexible section which permits the leaf to flex about said body portion, said leaf having a face engaged by said adjusting means and being flexed about said body portion when said adjusting means is adjusted, said leaf engaging said movable element to move the latter when the leaf is flexed, thereby to adjust said variable impedance device.

2. The apparatus defined by claim 1 wherein the detachable securing means on said body portion comprises a pair of spaced legs each extending laterally from one side of said portion and insertable into slot means formed in the tuner chassis.

3. The apparatus defined by claim 2 wherein said body portion is provided with stop means to limit the insertion of the legs into said chassis slot means.

4. The apparatus defined by claim 3 wherein the stop means comprises a pair of integrally formed ears respectively extending outwardly from opposed side edges of the body portion.

5. The apparatus defined by claim 1 wherein said body portion is provided with an integrally formed, hollow, cylindrical support extending laterally from one face thereof, said support having an open end facing said leaf, the movable element being disposed within said support and slidable therein, said fine tuning impedance element comprising conducting means extending around the exterior of said support.

6. The apparatus defined by claim 5 wherein the detachable securing means on the body portion comprises a pair of spaced integrally formed legs extending laterally from said one face of said body portion and generally parallel to said support, said legs being insertable into slot means in the chassis to attach said member to said chassis.

7. The apparatus defined by claim 6 wherein said body portion is provided with stop means to limit the insertion of the legs into said chassis slot means.

8. The apparatus defined by claim 7 wherein the stop means comprises a pair of integrally formed ears respectively extending outwardly from opposed side edges of the body portion.

9. An adjustable impedance for use in tuners and comprising a hollow cylindrical support having one closed end and one open end, a stud formed integrally with said support and extending axially therein from the closed end towards the open end, a coil of only a few turns wound around the exterior of said support, a ferromagnetic core mounted for sliding movement within said support and having an axial recess therein facing said stud and aligned therewith, a coil spring encircling said stud and seated within said recess to bias said core towards the open end of said support, so that one end of the core protrudes beyond the support, and means acting upon said one end of said core to move said core axially within said support and thereby vary the inductance of said coil, at least a portion of said spring being shielded from said coil by said ferromagnetic core when said spring is compressed and the turns thereof are relatively close together, thereby to minimize the effects of losses due to said spring upon said coil.

10. An adjustable impedance as defined in claim 9 wherein said support is formed of a plastic material and is provided with a pair of spaced apart, integral, laterally extending forks for respectively receiving the opposed ends of said coil, said ends of said coil being secured in place by heat sealing the same within said forks.

11. The apparatus defined by claim 9 wherein said support is formed integrally with a flat body portion lying in a plane extending normal to the axis of said support, said body portion having an integrally formed leaf joined thereto by a thin, flexible section permitting said leaf to flex about the body portion and said leaf extending away from said thin section and engaging said one end of said core.

12. The apparatus defined by claim 9 wherein said support, said body portion, said leaf and said thin section are formed of plastic material.

13. An adjustable impedance for use in tuners and comprising a body portion, a leaf formed integrally with said body portion and joined thereto by a thin, flexible section permitting said leaf to flex about said body portion, a hollow, cylindrical support formed integrally with said body portion and extending laterally therefrom, said support having an open end facing said leaf, and a movable element mounted for sliding movement within said support and having an end portion engaging said leaf so that said element is moved by flexing said leaf.

References Cited by the Examiner

UNITED STATES PATENTS

| | | | |
|---|---|---|---|
| 2,417,097 | 3/47 | Warshaw | 336—136 |
| 2,521,968 | 9/50 | De Tar et al. | 334—77 X |
| 2,702,860 | 2/55 | Farbanish | 336—136 |
| 3,022,674 | 2/62 | Cross et al. | 334—51 |
| 3,069,638 | 12/62 | Lindeman et al. | 334—74 X |
| 3,069,639 | 12/62 | Cappelle et al. | 334—76 X |

HERMAN KARL SAALBACH, *Primary Examiner.*